(12) United States Patent
Hickam

(10) Patent No.: US 8,970,246 B2
(45) Date of Patent: Mar. 3, 2015

(54) ASSEMBLY AND CIRCUIT STRUCTURE FOR MEASURING CURRENT THROUGH AN INTEGRATED CIRCUIT MODULE DEVICE

(75) Inventor: Christopher D. Hickam, Peora, IL (US)

(73) Assignee: Caterpillar Inc., Peoria, IL (US)

( * ) Notice: Subject to any disclaimer, the term of this patent is extended or adjusted under 35 U.S.C. 154(b) by 490 days.

(21) Appl. No.: 13/334,676

(22) Filed: Dec. 22, 2011

(65) Prior Publication Data

US 2012/0167026 A1     Jun. 28, 2012

Related U.S. Application Data

(60) Provisional application No. 61/426,611, filed on Dec. 23, 2010.

(51) Int. Cl.
| | |
|---|---|
| *G01R 31/02* | (2006.01) |
| *G01R 1/20* | (2006.01) |
| *G01R 31/00* | (2006.01) |
| *G01R 31/28* | (2006.01) |

(52) U.S. Cl.
CPC .............. *G01R 1/203* (2013.01); *G01R 31/006* (2013.01); *G01R 31/2818* (2013.01)
USPC ...................................... 324/762.02; 324/522

(58) Field of Classification Search
None
See application file for complete search history.

(56) References Cited

U.S. PATENT DOCUMENTS

| | | | |
|---|---|---|---|
| 4,001,684 A * | 1/1977 | Fritts | 324/126 |
| 4,348,773 A | 9/1982 | Caroli | |
| 4,713,607 A | 12/1987 | Pepper | |
| 5,336,990 A | 8/1994 | Maue | |
| 5,627,472 A | 5/1997 | Ofer et al. | |
| 6,340,927 B1 | 1/2002 | Peschl | |
| 6,940,266 B2 | 9/2005 | Roden et al. | |
| 7,170,295 B2 | 1/2007 | Hetzler | |
| 7,701,197 B2 | 4/2010 | Sherman et al. | |
| 2005/0134254 A1 | 6/2005 | Roden et al. | |
| 2007/0152676 A1 | 7/2007 | Lee | |

FOREIGN PATENT DOCUMENTS

| | | |
|---|---|---|
| EP | 1832885 A1 | 9/2007 |
| JP | 2008-047571 A | 2/2008 |

* cited by examiner

*Primary Examiner* — Minh N Tang
(74) *Attorney, Agent, or Firm* — Uchendu O. Anyaso

(57) ABSTRACT

An assembly and circuit structure for measuring current through an integrated circuit (IC) module device is disclosed. The circuit structure includes a power supply, at least one IC module device, at least one amplifier, and a resistive washer. The power supply can be configured to generate direct or alternating current. The at least one IC module device having a pair of terminals can be configured to receive the generated current. The at least one amplifier can be configured to measure the amount of current that flows through the IC module device. The at least one amplifier may be electrically coupled to a resistor. Also, a resistive washer may be configured to oppose current flow through the at least one IC module so as to redirect current to flow through the resistor.

4 Claims, 6 Drawing Sheets

ASSEMBLY AND CIRCUIT STRUCTURE FOR MEASURING CURRENT THROUGH AN INTEGRATED CIRCUIT MODULE DEVICE

TECHNICAL FIELD

The present disclosure relates generally to an assembly and circuit used for the measurement of currents in engines and machines, and more particularly, to the measurements of direct and alternating currents in a cost-effective manner.

BACKGROUND

A challenge faced by manufacturers is ways to reduce cost of trucks and vehicles. Thus, engineers and administrators are continually cognizant of parts used in systems, with a desire to optimally use a part that is low in cost while efficiently meeting desired functionalities such a part is configured for.

Current solutions for measuring current that flows through an integrated circuit module device employ current sensors to achieve such measurements. U.S. Pat. No. 6,940,266 to Roden et al discloses a current sensor arrangement that makes use of a bolted connection to measure current that flows through a power device structure. The structure of '266 patent is assembled by passing a threaded portion of bolt 624 through an aperture 622ap in terminal lug 622, through aperture 630ap extending through printed-circuit board 630, and into threaded aperture 616. When tightened, the head 624h of bolt 624 bears against the upper surface of terminal lug 622, and presses the lower surface of terminal lug firmly against the upper surface of conductor 640. At the same time, the bolt holds the lower surface of lower conductor 630g firmly against electrode 614 of the electrical control device 612.

The bolt 624 in the '266 patent is conductive, so there is a continuous path for electrical conduction from terminal lug 622 through bolt 624 to electrode 614 of device 612. In addition, as illustrated in FIG. 7 of the '266 patent, there is also a conductive path extending from terminal lug 622 through conductive path 640 to electrical connections 234a which extends fully through current sensor 230), and through apertures 664a to lower conductor layer 630g, and by way of conductor layer 630g to device electrode 614. Consequently, there are two separate and distinct paths for the flow of current from terminal lug 622 to electrode 614 of device 612, namely a first path extending vertically through the printed-circuit board by way of bolt 624, and a second path which extends by way of printed-circuit paths 640 and 630g and through current sensor 230. Thus, tightening the bolt 624 causes a power connection to a current-handling device, as well as a parallel connection to a current sensor.

However, the great cost and inconvenience of current sensors capable of measuring currents has been problematic for circuit designers. As one example, per unit cost of current sensors are relatively high. Thus, electronic devices using multiple current sensor tend to be relatively exorbitant. Moreover, current sensors have the disadvantage that overcurrent protection is complicated by the sensitivity of the current sensors to high-frequency noise. This sensitivity can manifest itself as tripping of the overcurrent device die to noise generated by such a current sensor.

Thus, conventional techniques of measuring currents through integrated circuit modules using current sensor assemblies have resulted in system failures. Perhaps even worse, such systems using current sensors are relatively more expensive than desired. It is therefore desirable to provide, among other things, an improved current measuring assembly and circuit structure.

SUMMARY OF THE INVENTION

In accordance with one embodiment, the present disclosure is directed to an assembly for measuring current applied to an integrated circuit module. The assembly includes a bolt having a threaded male portion corresponding to a threaded aperture. The assembly also includes a bus structure arrangement in contact with the bolt. The bus structure includes an insulating layer sandwiched between an upper electrical conductive layer and a lower electrical conductive layer. The bus structure arrangement can be configured to receive current applied from an external power supply. The assembly can also include an IC module device having an electrically conductive terminal region and a threaded aperture within the confines of said terminal region. Such terminal region can be configured to receive current to be measured. The assembly also includes a resistive washer that can be in electrical contact with the bus structure and the electrically conductive terminal region of the IC module. Such resistive washer may be configured to provide opposition to the current that flows between the bus structure and the electrically conductive terminal of the IC module device. The bus structure, the resistive washer and the IC module can each define an aperture large enough to clear the threaded male portion of the bolt. The bolt extends through the aperture of the bus structure, the resistive washer and the IC module, in the stated order. The bolt also includes a male portion threaded into the threaded aperture of the IC module device, to thereby fasten the bus structure, the resistive washer and the IC module together in order to provide a desired electrical contact.

In another embodiment, the present disclosure is directed to a process of making an integrated circuit product. The process includes forming a bolt including a threaded male portion corresponding to a threaded aperture. The process also includes creating a bus structure arrangement in contact with the bolt. Such bus structure can be configured with an insulating layer that is sandwiched between an upper electrical conductive layer and a lower electrical conductive layer. The bus structure arrangement can receive current applied from an external power supply. The process also includes placing an IC module device including an electrically conductive terminal region and a threaded aperture within the confines of the terminal region. The bus structure may receive the applied current to be measured. The process further includes attaching a resistive washer in electrical contact with the bus structure and the electrically conductive terminal region of the IC module. The resistive washer can provide opposition to the current that flows between the bus structure and the electrically conductive terminal of the IC module device. The process also includes fastening the bolt. The bus structure, the resistive washer and the IC module each define an aperture large enough to clear the threaded male portion of the bolt. The bolt may extend through the aperture of the bus structure, the resistive washer and the IC module, in the stated order. The bolt can also have its male portion threaded into the threaded aperture of the IC module device, to thereby fasten the bus structure, the resistive washer and the IC module together in order to provide desired electrical contact.

In another embodiment, the present disclosure is directed to a circuit for measuring alternating current. The circuit includes a power supply to generate alternating current of the same frequency. At least three integrated circuit (IC) modules are each electrically coupled to the power supply. The at least three power modules are configured to carry alternating currents. Further, the at least three amplifiers can measure the alternating currents that flow through each of the at least three IC modules. Each of the at least three amplifiers may be electrically coupled to the power supply and to respective ones of the at least three IC modules. At least one resistor may be electrically coupled to each of the at least three amplifiers. The circuit may also include at least one resistive washer electrically coupled between the power supply and each of the at least three IC modules. The at least one resistive washer can be configured to oppose current flow through each respective IC module so as to cause current to flow through the resistor.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
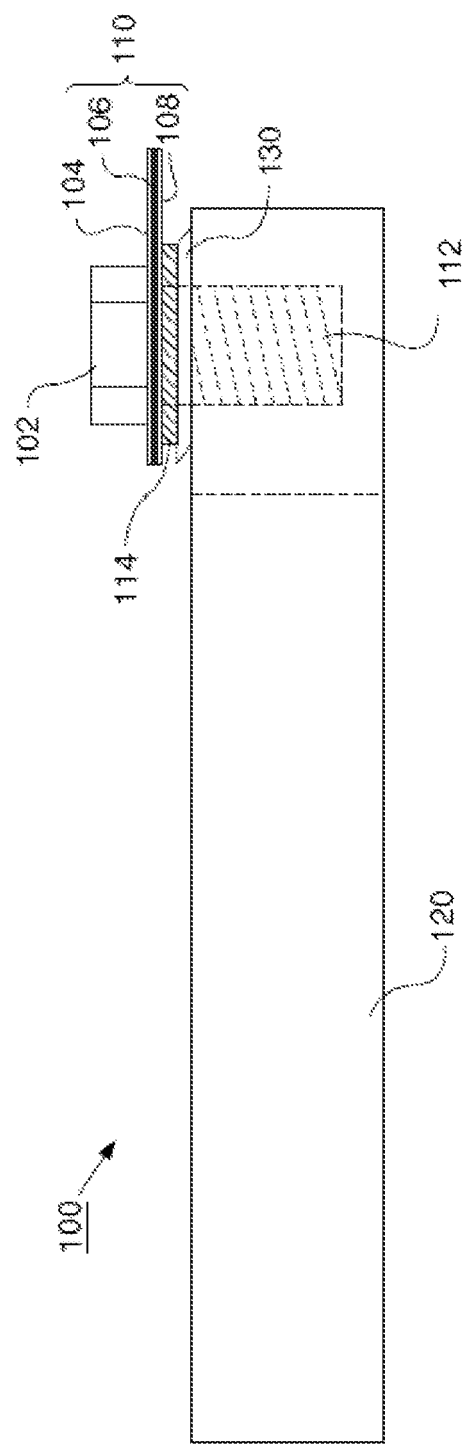
FIG. 1 illustrates a cross-sectional view of a structure in an assembled form for measuring current through an integrated circuit module device.

FIG. 1 illustrates a cross-sectional view of a structure in an assembled form 100 for measuring current through an integrated circuit module device 120. The assembly 100 employs a bolt 102 having a threaded male portion 112 corresponding to a threaded aperture. The bolt 102 can be made of a ceramic-coated material. Such coating can be a nonmetallic mineral, such as clay that is capable of providing, for example, heat or abrasive-wear protection. Of course, other materials such as some plastics or other synthetic materials may be used. Bolt 102 can also provide fastening properties to hold other parts of the assembly 100 in place.

The assembly 100 may also include a bus structure 110 in contact with the bolt 102. The bus structure 110 includes an upper electrical conductive layer 104 and a lower electrical conductive layer 108 with an insulating layer 106 sandwiched therebetween. Such conductive layers 104, 108 can be made of metallic materials such as copper, which are known to contain movable charges. The insulating layer 106 can be formed of, for example, silicon oxide or silicon nitride. Of course, other metallic and insulating materials can be used. The bus structure 110 can be configured to receive current applied from an external power supply. The assembly 100 can also include an IC module device 120 having an electrically conductive terminal region 130 and a threaded aperture (not shown) within the confines of said terminal region. Such terminal region 130 can be configured to receive current to be measured.

The assembly 100 may also include a resistive washer 114 that can be in electrical contact with the bus structure 110 and the electrically conductive terminal region 130 of the IC module 120. Such resistive washer 114 can be configured to provide opposition to the current that flows between the bus structure 110 and the electrically conductive terminal 130 of the IC module device 120. In alternative embodiments, a washer such as a square washer can be used in place of a resistive washer. Such washer may be configured with tabs on it to prevent it from turning. The square washer can also be configured as a multi-material plate that may cover multiple terminals with multiple resistors that can each be isolated from each other. The bus structure 110, the resistive washer 114 and the IC module device 120 can each define an aperture large enough to clear the threaded male portion 112 of the bolt 102. The bolt 102 extends through the apertures of the bus structure 110, the resistive washer 114 and the IC module 120, in the stated order. Such bolt extension of the threaded male portion 112 enables the bolt 102 to fasten the bus structure 110, the resistive washer 114 and the IC module 120 together in order to provide a desired electrical contact.

In one example, current flow through resistive washer 114 creates a potential difference across the resistive washer 114 so that actual current can be measured. In another example, the bus structure 110 of assembly 100 is configured to cancel out parasitic inductances and to provide a conductive layer for current passage. In another example, the bolt 102 is made of insulated ceramic-coated material.

Figure 2:
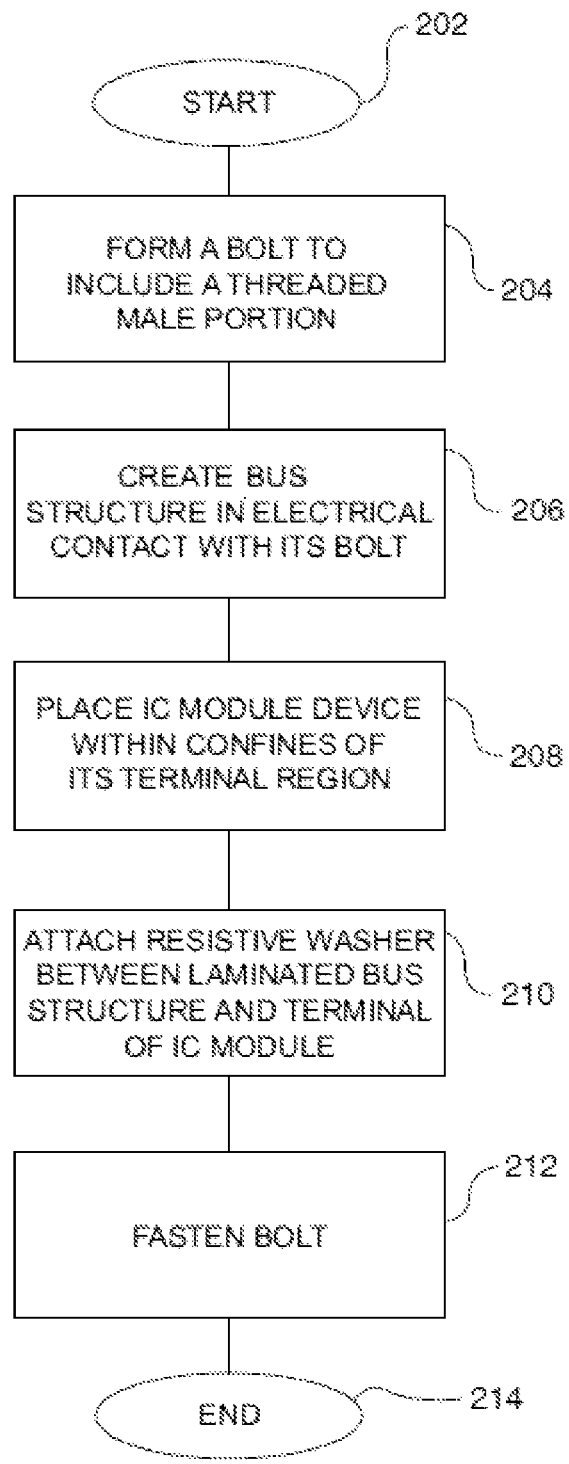
FIG. 2 illustrates in flow chart form a process for making an integrated circuit product according to an embodiment of the present disclosure.

FIG. 2 illustrates in flow-chart form a process for making an integrated circuit product according to an embodiment of the present disclosure. The process starts in operation 202. In operation 204, a bolt is formed to include a threaded male portion corresponding to a threaded aperture. In one example, the bolt is formed of an insulated ceramic-coated material. In operation 206, a bus structure arrangement is created. The bus structure can then be contacted with the bolt. Such bus structure can be created with an insulating layer that is sandwiched therebetween an upper electrical conductive layer and a lower electrical conductive layer. The bus structure arrangement can receive current applied from an external power supply. In operation 208, an IC module device is placed with an electrically conductive terminal region and a threaded aperture within the confines of the terminal region. The bus structure may receive the applied current to be measured. In operation 210, the process further includes attaching a resistive washer to be in electrical contact with the bus structure and the electrically conductive terminal region of the IC module. The resistive washer can provide opposition to the current that flows between the bus structure and the electrically conductive terminal of the IC module device. In operation 212, the bolt may be fastened. It is noteworthy that the bus structure, the resistive washer and the IC module each define an aperture large enough to clear the threaded male portion of the bolt. The bolt may extend through such aperture of the bus structure, the resistive washer and the IC module, in the stated order. The bolt can also have its threaded male portion threaded into the threaded aperture of the IC module device, to thereby fasten the bus structure, the resistive washer and the IC module together in order to provide a desired electrical contact. The process ends in operation 214. It will be recognized that these operations may be performed in any suitable order and that other fabrication techniques may be employed as desired.

Figure 3:
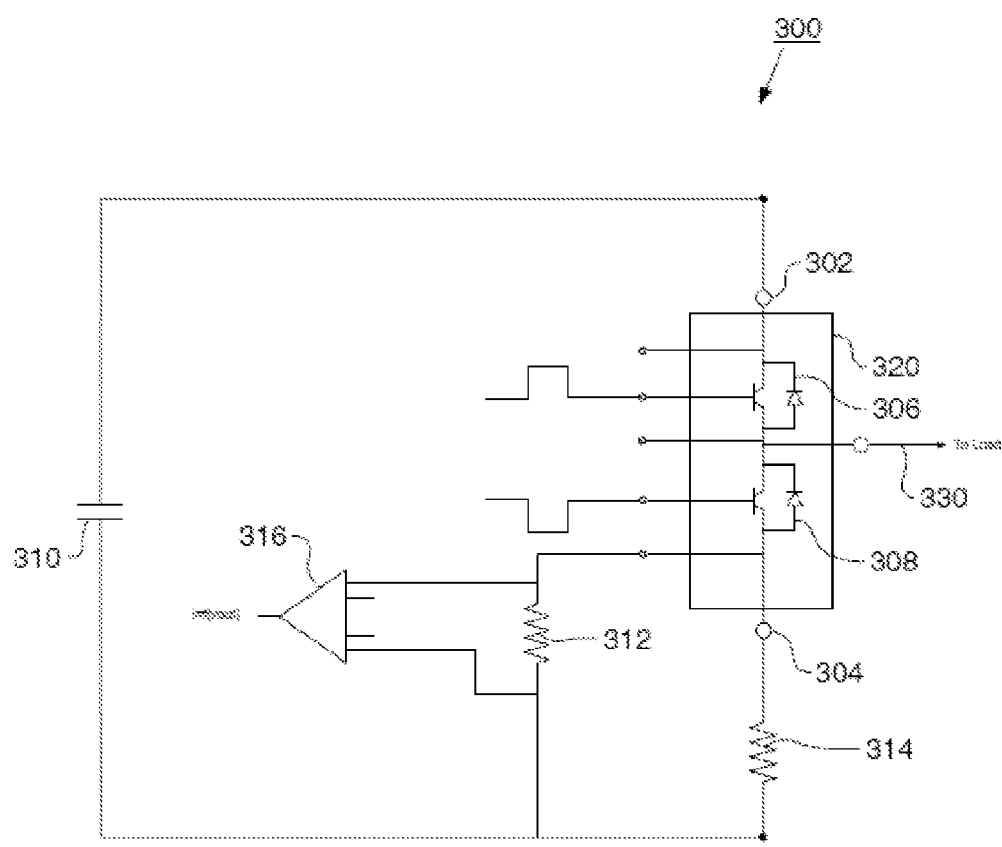
FIG. 3 illustrates an embodiment of a circuit level description used for direct current measurement through an integrated circuit (IC) module device.

FIG. 3 illustrates an embodiment of a circuit level description used for direct current measurement through an integrated circuit (IC) module device. In this embodiment, the circuit level system 300 includes a power supply 310 configured to generate direct current. The power supply 310 can provide a constant steady flow of electricity in one direction. At least one IC module device 320 having a pair of terminals 302, 304 can be configured to receive the generated direct current. A resistive washer 314 may be electrically coupled between the power supply 310 and the at least one IC module 320. Such resistive washer 314 can be configured to oppose current flow through the IC module 320 in order to redirect the current to flow through, for example, a resistor 312 that provides a less resistance path for the current flow. The resistor 312 may be located remotely, perhaps within the drive electronics. The resistive washer 314 can be configured with a value large enough to oppose the current flow. Such value may depend on the complexity of the IC module device 320 through which current flows. At least one amplifier 316 may be electrically coupled to the terminals of the IC module device and the power supply so as to measure the amount of current that flows through the IC module. The resistor 312 may be connected in series or parallel with the at least one amplifier.

In one example, the IC module device 320 can be an inverter. In an exemplary normal operation, the IC module device 320, which in this case is an inverter, can be constructed of bipolar junction transistors 306, 308. Of course, the inverter can be constructed using other configurations such as CMOS transistors, or resistor-transistor logic (RTL), or transistor-transistor logic (TTL), or Insulated Gate Bipolar Transistors (IGBTs), or Metal Oxide Semiconductor Field Effect Transistors (MOSFETs), etc. Thus, in a first time instance ($t_0$) when transistor 306 is turned on, transistor 308 is turned off, and vice versa. In such an instance when transistor 306 is turned on and transistor 308 is turned off, current generated from the power supply 310 flows through terminal 302, and through the emitter of transistor 306 to an output load 330. The output load 330 can be a motor have inductive windings or magnets. Such motor can also include a Hall effect sensor, which is a transducer that varies its output voltage in response to changes in magnetic field. As such, electricity carried through transistor 306 to load 330 can produce a magnetic field that varies with current. This current that flows through IC module device 320 is captured and stored momentarily by the inductive windings between time $t_0$ and a second time instant, $t_1$. In the second time instance ($t_1$), transistor 306 is off, and transistor 308 is on. Herein, the current through the inductive load, which corresponds to the current that flowed through terminal 302 of IC module device when transistor 306 was on and transistor 308 was off, now flows through the collector of transistor 308, then through the emitter of transistor 308, and then through the terminal 304 of the IC module device 320. The resistive washer 314 has a low resistive value such that majority of the current from the IC module device 320 will flow through it. Resistor 312 is configured with a large value so that very little current flows through it from the IC module device 320. The voltage across resistor 312 can be amplified and measured via operational amplifier 316. This voltage may corresponds to the voltage across the resistive washer 314. Thereafter, using Ohm's law, the current opposed by resistive washer 314 can be calculated since the values of the resistive washer 314 and the potential difference across the resistive washer are now known.

In one example, the resistor 312 and the resistive washer 314 can be configured with size ratios of approximately 100:1, 1000:1, etc.

Figure 4:
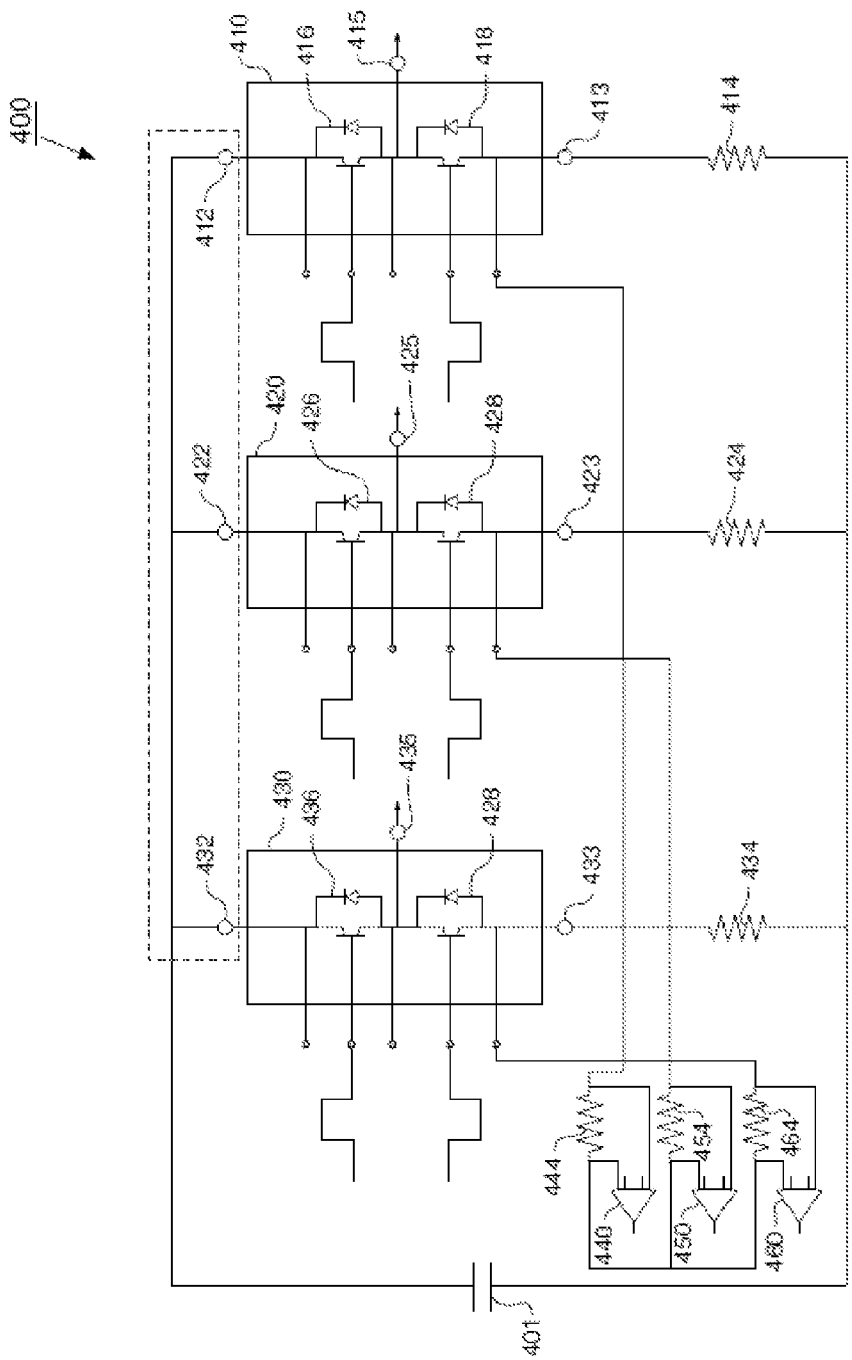
FIG. 4 illustrates an embodiment of a circuit level description used for alternating current measurement through an integrated circuit (IC) module device.

FIG. 4 illustrates an embodiment of a circuit level description used for alternating current measurement through an integrated circuit (IC) module device. The circuit 400 includes a power supply 401 to generate alternating current of the same frequency. At least three integrated circuit (IC) module devices 410, 420, 430 are each electrically coupled to the power supply 401. The at least three IC module devices 410, 420, 430 can be arranged in a three-phase arrangement to carry three different alternating currents of the same frequency which reach their instantaneous peaks at different times. As used herein, a three-phase arrangement permits three circuit conductors to carry three alternating currents of the same frequency which reach their respective instantaneous peak values at different times. Therefore, taking one conductor as the reference, the other two currents are delayed in time by one-third (⅓) and two-thirds (⅔) of one cycle of the electric current. This delay between phases has the effect of giving constant power transfer over each cycle of the current and also makes it possible to produce a rotating magnetic field in an electric motor, such as loads 415, 425, 435.

Further, at least three amplifiers 440, 450, 460 can be electrically coupled, respectively, to the terminals 413, 423, 433 of each of the IC module devices 410, 420, 430. The at least three amplifiers 440, 450, 460 can measure respective values of alternating current that flows through each of the at least three IC module devices 410, 420, 430. At least one resistor 444, 454, 464 may be electrically coupled, respectively, to each of the at least three amplifiers 440, 450, 460 and to respective terminals 413, 423, 433 of the IC modules devices 410, 420, 430. The circuit may also include at least one resistive washer 414, 424, 434 electrically coupled between the power supply and each of the respective terminals 413, 423, 433 of the IC modules devices 410, 420, 430. Each of the resistive washers 414, 424, 434 can be configured to oppose current flow through each respective IC module devices 410, 420, 430 so as to cause current to flow through the resistor 444, 454, 464, respectively. Detailed operations of the circuit in FIG. 4 will now be explained using an equivalent simplified circuit of FIG. 5.

Figure 5:
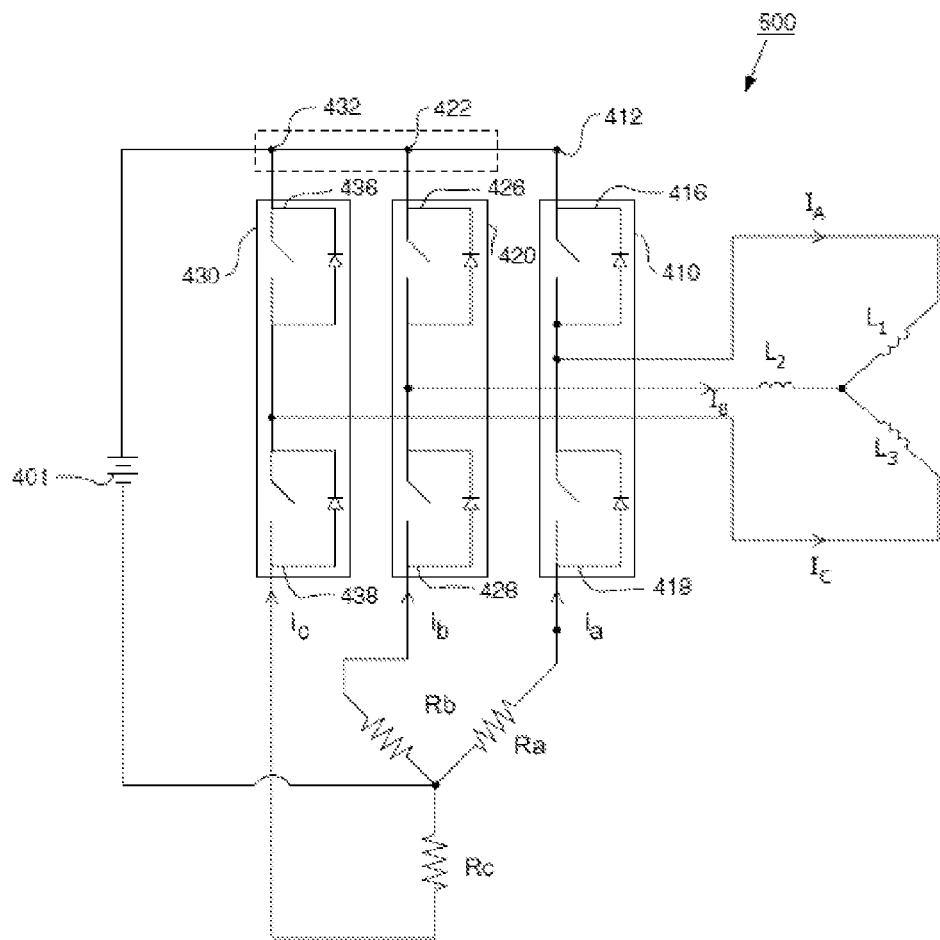
FIG. 5 illustrates an exemplary embodiment of an equivalent circuit level description of FIG. 4 used for determining the current that flows through an integrated circuit (IC) module device.

FIG. 5 illustrates an exemplary embodiment of an equivalent circuit level description of FIG. 4 used for determining the current that flows through an integrated circuit (IC) module device. In one example, the sum of the output currents from IC module devices 410, 420, 430 is zero. That is:

$$I_A + I_B + I_C = 0 \quad \text{(equation 1)}$$

The IC module devices 410, 420, 430 can be an inverter with switches 416, 418, 426, 428, 436, 438. Thus, in a first time instance ($t_0$), switches 416, 426, 436 are each turned on (i.e., closed), while switches 418, 428, 438 are turned off (i.e., open). Thus, at time, ($t_0$), current generated from the power supply 401 flows through terminals 412, 422, 432 (same node), and through each respective the closed switches 416, 426, 436 to each respective inductive output loads, $L_1$, $L_2$, $L_3$. Such currents through $L_1$, $L_2$, $L_3$ can be represented by $I_A$, $I_B$, $I_C$, respectively. The output loads $L_1$, $L_2$, $L_3$ can each be a motor having inductive windings or magnets. Such motor can also include a Hall effect sensor, which is a transducer that varies its output voltage in response to changes in magnetic field. As such, electricity carried through switches 416, 426, 436 to loads $L_1$, $L_2$, $L_3$ can produce a magnetic field that varies with current. This current that flows through IC module device 320 is captured and stored momentarily by the inductive windings between time $t_0$ and a second time instant, $t_1$. In a second time instance, ($t_1$), switches 416, 426, 436 are turned off (i.e., open), while switches 418, 428, 438 are turned on (i.e., closed). Herein, the currents $I_A$, $I_B$, $I_C$ respectively through the inductive loads $L_1, L_2, L_3$, now flows through the closed switches 418, 428, 438 toward respective resistive washers Ra, Rb, Rc. However, resistive washers Ra, Rb, Rc each have large values and are configured to oppose the currents $I_A, I_B, I_C$ that flow from the IC module devices 410, 420, 430 towards the resistive washers Ra, Rb, Rc. Thus, the currents opposed by resistive washers Ra, Rb, Rc can be represented by $i_a, i_b, i_c$, respectively. Thus, $$i_a = I_A; i_b = I_B; i_c = I_C \qquad \text{(equation 2)}$$

Further, when synchronously sampled with pulse width modulation (PWM), amplifiers such as differential amplifiers can be used to measure the voltages across each resistive washer. Such voltage information can be represented as measured voltages Vab, Vbc, Vca between each pair combination of IC module devices 410, 420, 430. Thus, using Ohm's law, the currents, $i_a, i_b, i_c$, respectively opposed by resistive washers Ra, Rb, Rc can be calculated. That is:

$$i_a Ra + i_b Rb = Vab$$

$$i_b Rb + i_c Rc = Vbc$$

$$i_c Rc + i_a Ra = Vca \qquad \text{(equation 3)}$$

Since the values of Vab, Vbc, Vca and Ra, Rb, Rc have been determined, we now have three equations (i.e., equation 1 through equation 3) and three unknowns, $i_a, i_b, i_c$. A person of ordinary skill can now calculate the values $i_a, i_b, i_c$, which also correspond to the current that flows through each of the IC module devices 410, 420, 430.

An exemplary sequence of operation will now be described with respect to the three-phase inverter shown in FIG. 5.

Sequence 1: During sequence 1 these two states are repeated at the PWM frequency until sequence 2 begins.
State 1: Switches 426, 438 and 418 are energized allowing current to flow through 426 into the machine and return to the inverter through switches 438 and 418.
State 2: Switches 426, 438 and 418 are opened and current then flows through the anti-parallel diode of switch 428 into the machine and returns to the inverter through the anti-parallel diodes of switches 416 and 436.

Sequence 2: During sequence 2 these two states are repeated at the PWM frequency until sequence 3 begins.
State 1: Switches 436, 426 and 418 are energized allowing current to flow through switches 436 and 426 into the machine and return to the inverter through switch 418.
State 2: Switches 436, 426 and 418 are opened and current then flows through the anti-parallel diodes of switches 438 and 428 into the machine and returns to the inverter through the anti-parallel diodes of switch 416.

Sequence 3: During sequence 3 these two states are repeated at the PWM frequency until sequence 4 begins.
State 1: Switches 436, 428 and 418 are energized allowing current to flow through switch 436 into the machine and return to the inverter through switches 428 and 418.
State 2: Switches 436, 428 and 418 are opened and current then flows through the anti-parallel diode of switch 438 into the machine and returns to the inverter through the anti-parallel diodes of switches 426 and 416.

Sequence 4: During sequence 4 these two states are repeated at the PWM frequency until sequence 5 begins.
State 1: Switches 436, 416 and 428 are energized allowing current to flow through switches 436 and 416 into the machine and return to the inverter through switch 428.
State 2: Switches 436, 416 and 428 are opened and current then flows through the anti-parallel diodes of switches 438 and 418 into the machine and returns to the inverter through the anti-parallel diode of switch 426.

Sequence 5: During sequence 5 these two states are repeated at the PWM frequency until sequence 6 begins.
State 1: Switches 416, 438 and 428 are energized allowing current to flow through switch 416 into the machine and return to the inverter through switches 438 and 428.
State 2: Switches 416, 438 and 428 are opened and current then flows through the anti-parallel diode of switch 418 into the machine and returns to the inverter through the anti-parallel diodes of switches 436 and 426.

Sequence 6: During sequence 6 these two states are repeated at the PWM frequency until sequence 1 begins.
State 1: Switches 426, 416 and 438 are energized allowing current to flow through switches 426 and 416 into the machine and return to the inverter through switch 438.
State 2: Switches 426, 416 and 438 are opened and current then flows through the anti-parallel diodes of switches 428 and 418 into the machine and returns to the inverter through the anti-parallel diode of switch 436.

This is commonly referred to as six sequence commutation because the six sequences are cycled through at a frequency equal to the electrical fundamental frequency.

Industrial Applicability

The disclosed circuit structure and assembly for measuring current through an integrated module may be provided in any machine or engine where current measurement is a requirement. As one example, the circuit structure and assembly for measuring current through an integrated module may be particularly applicable to manufacturers and engineers that desire optimally use a part that is low in cost while efficiently meeting desired functionalities such a part is configured for. The process of assembling a structure for measuring current applied to an IC module will now be explained.

During normal operations, the assembly 100 employs a bolt 102 having a threaded male portion 112 corresponding to a threaded aperture. The bolt 102 can be made of a ceramic-coated material. Such coating can be a nonmetallic mineral, such as clay that is capable of providing, for example, heat or abrasive-wear protection. Bolt 102 can also provide fastening properties to hold other parts of the assembly 100 in place. The assembly 100 may also include a bus structure 110 in contact with the bolt 102. The bus structure 110 includes an upper electrical conductive layer 104 and a lower electrical conductive layer 108 with an insulating layer 106 sandwiched therebetween. Such conductive layers 104, 108 can be made of metallic materials such as copper, which are known to contain movable charges. The insulating layer 106 can be formed of, for example, silicon oxide or silicon nitride. Of course, other metallic and insulating materials can be used. The bus structure 110 can be configured to receive current applied from an external power supply. The assembly 100 can also include an IC module device 120 having an electrically conductive terminal region 130 and a threaded aperture (not shown) within the confines of said terminal region. Such terminal region 130 can be configured to receive current to be measured. The assembly 100 may also include a resistive washer 114 that can be in electrical contact with the bus structure 110 and the electrically conductive terminal region 130 of the IC module 120. Such resistive washer 114 can be configured to provide opposition to the current that flows between the bus structure 110 and the electrically conductive terminal 130 of the IC module device 120. The bus structure 110, the resistive washer 114 and the IC module device 120 can each define an aperture large enough to clear the threaded male portion 112 of the bolt 102. The bolt 102 extends through the aperture of the bus structure 110, the resistive washer 114 and the IC module 120, in the stated order. The bolt 102 also includes a male portion threaded 112 into the threaded aperture of the IC module device 120 to thereby fasten the bus structure 110, the resistive washer 114 and the IC module 120 together in order to provide a desired electrical contact. In one example, the current flow through resistive washer 114 creates a potential difference across the resistive washer 114 so that actual current can be measured. In another example, the bus structure 110 of assembly 100 is configured to cancel out parasitic inductances and to provide a conductive layer for current passage. In another example, the bolt 102 is made of insulated ceramic-coated material.

Also, as regulations related to counter measures against such global warming and CO2 emissions become stricter, low cost and environmentally friendly circuit structures and assemblies using resistive washers instead of current sensors as described in embodiments herein help provide such heavily sought after accuracy measurements.

Figure 6:
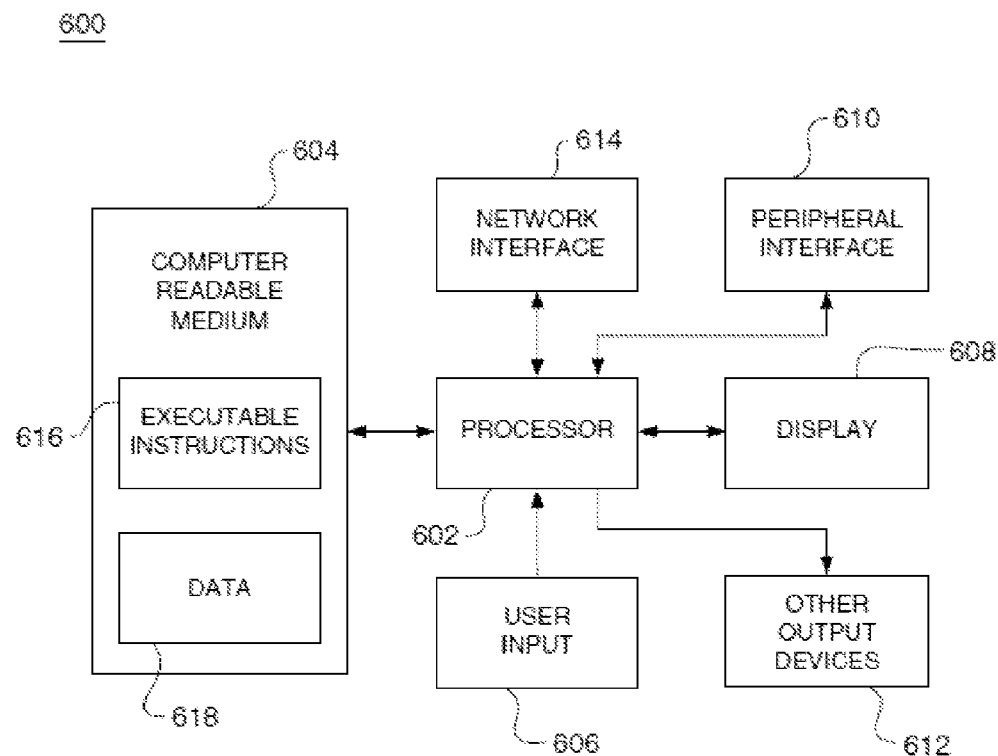
FIG. 6 illustrates in block diagram form an exemplary processing device that may be used to implement techniques described herein.

Referring now to FIG. 6, an exemplary device 600 that may be used to implement the present disclosure is further illustrated. With reference once again to FIGS. 3-5, the device 600 or similar devices may be used to implement, for example, the one or more circuits systems 300, 400, 500 that, in turn, may be used to implement, for example, a current measurement circuit. Regardless, the device 600 comprises a processor 602 coupled to a computer-readable medium 604. The computer-readable medium 604, in turn, comprises stored executable instructions 616 and data 618. In an embodiment, the processor 602 may comprise one or more processing devices such as a microprocessor, microcontroller, digital signal processor, or combinations thereof capable of executing the stored instructions 616 and operating upon the stored data 618. Likewise, the computer-readable medium 604 may comprise one or more devices such as CDROM, RAM, other forms of ROM, hard drives, distributed memory etc. Processor and storage arrangements of the types illustrated in FIG. 6 are well known to those having ordinary skill in the art. In this embodiment, the processing techniques described herein in circuit systems 300, 400, 500 are implemented as a combination of executable instructions and data within the computer-readable medium 604.

In a one embodiment, the device 600 may comprise one or more user input devices 606, a display 608, a peripheral interface 610, other output devices 612 and a network interface 614 all in communication with the processor 602. The user input device 606 may comprise any mechanism for providing user input to the processor 602. For example, the user input device 606 may comprise a keyboard, a mouse, a touch screen, microphone and suitable voice recognition application or any other means whereby a user of the device 600 may provide input data to the processor 602. The display 608, may comprise any conventional display mechanism such as a cathode ray tube (CRT), flat panel display, or any other display mechanism known to those having ordinary skill in the art. The peripheral interface 610 may include the necessary hardware, firmware and/or software necessary to communication with various peripheral devices, such as media drives (e.g., magnetic disk or optical disk drives) or any other source of input used in connection with the instant techniques. Likewise, the other output devices 612 may optionally comprise similar media drive mechanisms as well as other devices capable of providing information to a user of the device 600, such as speakers, LEDs, tactile outputs, etc. Finally, the network interface 614 may comprise hardware, firmware and/or software that allows the processor 602 to communicate with other devices via wired or wireless networks, as known in the art.

While the device 600 has been described as an embodiment for implementing the techniques described herein, those having ordinary skill in the art will appreciate that other, functionally equivalent techniques may be equally employed. For example, as known in the art, some or all of the executable instruction-implemented functionality may be implemented using firmware and/or hardware devices such as application specific integrated circuits (ASICs), programmable logic arrays, state machines, etc. Further still, other implementation of the device 600 may include a greater or lesser number of components than those illustrated. For example, when used to implement the system 300, 400, 500, the device 600 may not include the display 608 or user inputs 606. Once again, those of ordinary skill in the art will appreciate the wide number of variations that may be used is this manner.

Also, integrated circuit design systems (e.g., work stations) are known that create integrated circuits based on executable information stored on a computer readable memory such as but not limited to CDROM, RAM, other forms of ROM, hard drives, distributed memory etc. The information may include data representing (e.g., compiled or otherwise represented) any suitable language such as, but not limited to, hardware descriptor language or other suitable language. As such, the circuits and/or modules described herein may also be produced as integrated circuits by such systems. For example, an integrated circuit may be created using information stored on a computer readable medium that when executed cause the integrated circuit design system to create a current measurement circuit that includes a power supply, at least one IC module device, at least one amplifier, and a resistive washer. The power supply is configured to generate direct current. The IC module device having a pair of terminals can be configured to receive the generated direct current. The least one amplifier electrically can configured to measure the amount of current that flows through the IC module, the at least one amplifier having a electrical coupled to a resistor connected. Also, a resistive washer may be configured to oppose current flow through the IC module so as to direct current to flow through the resistor. Integrated circuits having a circuit and/or module that perform other operations described herein may also be suitably produced.

While this disclosure includes particular examples, it is to be understood that the disclosure is not so limited. Numerous modifications, changes, variations, substitutions and equivalents will occur to those skilled in the art without departing from the spirit and scope of the present disclosure upon a study of the drawings, the specification and the following claim.

What is claimed is:

1. An assembly for measuring current applied to an integrated circuit (IC) module, comprising:
   a bolt including a threaded male portion corresponding to a threaded aperture;
   a bus structure arrangement in contact with the bolt, the bus structure having an insulating layer sandwiched between an upper electrical conductive layer and a lower electrical conductive layer, said bus structure arrangement configured to receive current applied from an external power supply;
   an IC module including an electrically conductive terminal region and a threaded aperture within the confines of said terminal region, for receiving current to be measured; and
   a resistive washer in electrical contact with the bus structure and the electrically conductive terminal region of the IC module, the resistive washer configured to provide opposition to the current that flows between the bus structure and the electrically conductive terminal region of the IC module, wherein said bus structure, said resistive washer and said IC module each define an aperture large enough to clear said threaded male portion of said bolt, said bolt extending through said aperture of said bus structure, said resistive washer and said IC module, in the stated order, and having its male portion threaded into said threaded aperture of said IC module, to thereby fasten said bus structure, said resistive washer and said IC module together in order to provide desired electrical contact.

2. The assembly of claim 1, wherein the current flow through resistive washer creates a potential difference across the resistive washer so that actual current is measured.

3. The assembly of claim 1, wherein the bus structure is configured to cancel out parasitic inductances and provide a conductive layer for current passage.

4. The assembly of claim 1, wherein the bolt is comprised of an insulated ceramic coated material.

* * * * *